United States Patent [19]

Murotani

[11] Patent Number: 4,723,227

[45] Date of Patent: Feb. 2, 1988

[54] REDUNDANT TYPE MEMORY CIRCUIT WITH AN IMPROVED CLOCK GENERATOR

[75] Inventor: Tatsunori Murotani, Tokyo, Japan

[73] Assignee: NEC Corporation, Tokyo, Japan

[21] Appl. No.: 607,050

[22] Filed: May 4, 1984

[30] Foreign Application Priority Data

May 6, 1983 [JP] Japan .................................. 58-78983

[51] Int. Cl.$^4$ ............................................... G11C 8/00
[52] U.S. Cl. .................................... 365/200; 365/194; 365/195
[58] Field of Search ....................... 365/200, 194, 195; 371/10

[56] References Cited

U.S. PATENT DOCUMENTS 4,576,455 10/1985 Iwahashi et al. .................... 365/200

Primary Examiner—James W. Moffitt
Attorney, Agent, or Firm—Sughrue, Mion, Zinn, Macpeak & Seas

[57] ABSTRACT

A redundant type memory circuit having a normal memory cell array, a first decoder circuit for operatively accessing normal array, a redundant memory cell array, a second decoder circuit for accessing the redundant array, and a programmable timing control circuit for enabling the first decoder circuit at a first delay period when no faulty cell exists in the normal array and at a second longer delay period when a faulty cell exists in the normal array.

16 Claims, 13 Drawing Figures

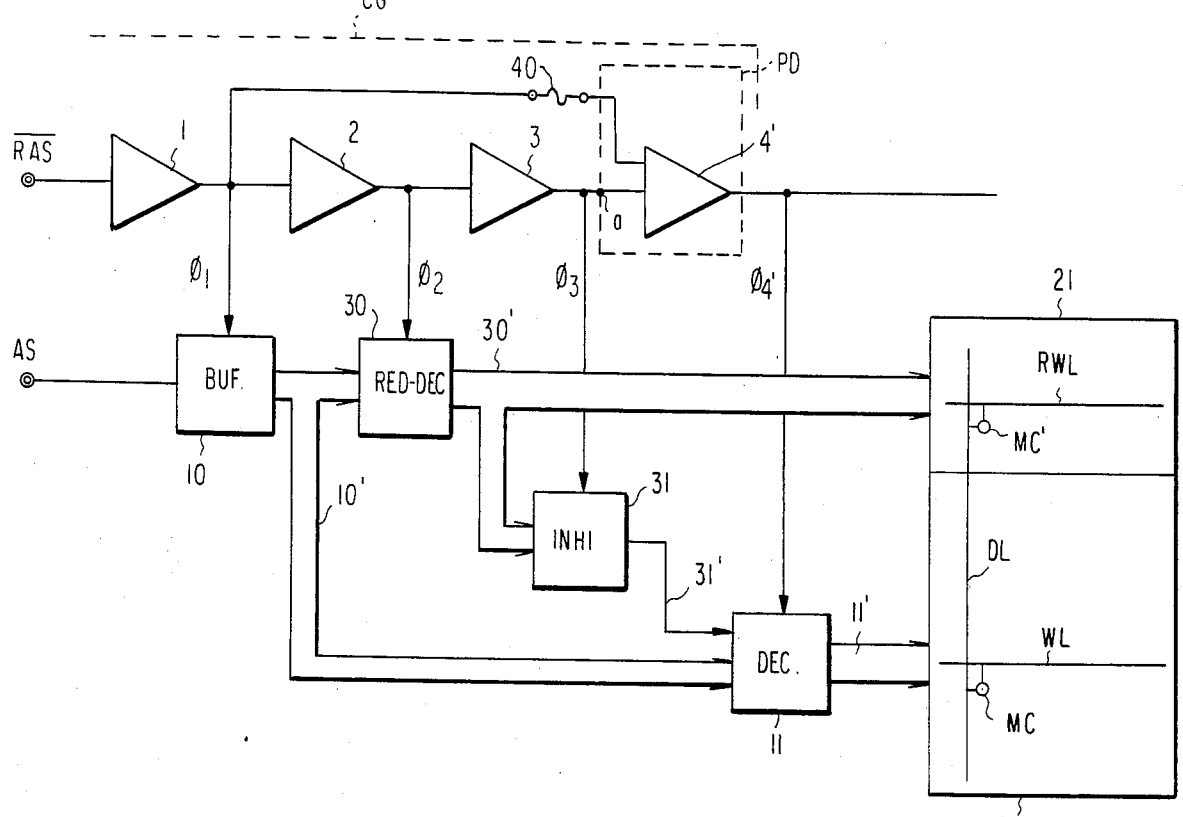
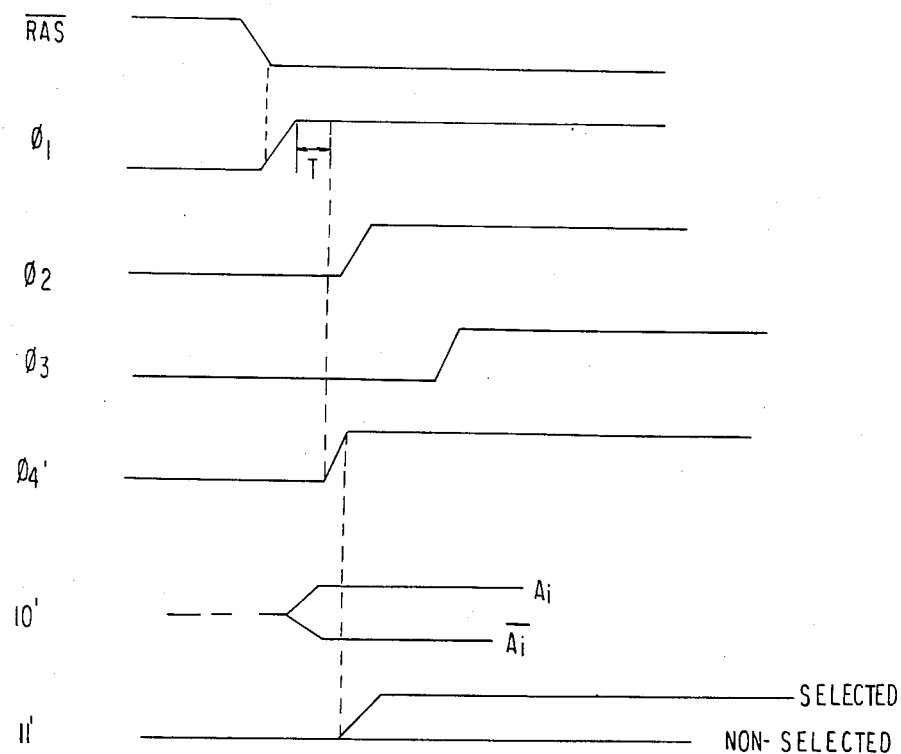

REDUNDANT TYPE MEMORY CIRCUIT WITH AN IMPROVED CLOCK GENERATOR

BACKGROUND OF THE INVENTION

The present invention relates to memory circuits, and more specifically to redundant type memory circuits having redundant structure.

The memory capacity of semiconductor memories has been recently increased, but the increase in the memory capacity has resulted in low fabrication yield due to the low probability of all circuit elements on such a dense structure being fabricated without defect. Hence, it has become difficult to obtain a memory in which all the constituent elements are good.

To reduce the above problem, memories having a redundant structure have been developed and are widely utilized. In a memory having a redundant structure, a redundant array of memory cells is provided in addition to a normal array of memory cells. If a cell or cells in the normal array are faulty or defective, such defective cells are functionally replaced by good cells in the redundant array, so that a functionally good memory can be obtained even though defects may be present in the normal array. In such a redundant type memory, the replacement of a defective cell in the normal array with a good cell in the redundant array is typically conducted by replacing a column or a row including the defective cell in the normal array with a column or a row of good cells in the redundant array. For achieving the above replacement of columns or rows, a programmable type redundant decoder circuit is provided to the redundant array to operatively select columns or rows of the redundant array. Information as to the address of the replaced columns or rows is stored by the programmable type redundant decoder. When a defective column or a defective row including the defective cell in the normal array is addressed from the outside, the programmable type redundant decoder circuit operates to select one column or one row in the redundant array while accessing of the defective column or defective row in the normal array is inhibited by an inhibit signal which is generated in response to a selection output of the redundant decoder circuit. Namely, when the redundant cell array is accessed by the redundant decoder, a normal decoder circuit provided to the normal array is inhibited from selecting the normal array.

In order to allow the above operation, it is inevitably necessary to control the normal decoder circuit after the establishment of the state of the redundant decoder circuit. Therefore, in the redundant type memory, the redundant decoder circuit is first activated, and then the normal decoder is activated only when the any column or row in the redundant array is not selected by the redundant decoder circuit, and the inhibit signal is not generated. Therefore, a clock generator employed in the redundant type memory is designed to generate a first clock for enabling the redundant decoder circuit, and thereafter generate a second clock for enabling the normal decoder circuit. However, even though all the elements in the normal array are good and the redundant decoder circuit is programmed not to select the redundant array, the activation of the normal decoder circuit is still performed by the second clock which is generated with a delayed time from the occurrence of the first clock, and hence operation of the memory is unnecessarily delayed, resulting in a low speed operation.

SUMMARY OF THE INVENTION

It is an object of the present invention to provide a memory circuit of the type having a redundant structure, which can operate at the highest possible speed.

A memory circuit according to the present invention is of the type having a normal array of memory cells, a redundant array of memory cells, a normal decoder circuit provided to the normal array of memory cells, a programmable redundant decoder circuit provided to the redundant array, a detection circuit for detecting that the redundant decoder circuit accesses the redundant array, a control circuit for inhibiting the operation of the normal decoder circuit when the detection circuit detects the access by the redundant decoder circuit, and a clock generator responsive to a control signal for generating a first clock for enabling the redundant decoder circuit and a second clock for enabling the normal decoder circuit after generation of the first clock, and is featured that a delay time from the activation of the control signal to the generation of the second clock is variable.

Specifically, in the case where the defective cell in the normal array is replaced by the good cell in the redundant array, the program means is programmed so as to set the delay time at a large value. On the contrary, in the case where no defective cell is present in the normal and the redundant array is not subjected to the replacement, the program means is programmed so as to set the delay time at a small value.

In the present invention, when the memory is manufactured with defect-free, there is no necessity of utilizing the redundant structure and ordering the operation of the normal decoder after the operation of the redundant decoder circuit, the second clock is generated with the minimum delay time so that the normal array can be accessed at the maximum speed. When the memory has the defective cell in the normal array, the second clock is generated with such delay time that the normal decoder circuit is enabled after the activation of the redundant decoder circuit.

In other words, according to the present invention, attention is paid to the fact that the time point when the normal decoder circuit starts its operation need not be delayed when the redundant array is not used even with the memory having the redundant array, and the time point when the normal decoder circuit starts its operation is delayed so as to allow the redundant decoder circuit to operate prior to the normal decoder circuit.

According to the present invention, when the memory has no defective cell in the normal array, a high speed operation can be obtained without increasing manufacturing steps and changing any circuit structure.

BRIEF DESCRIPTION OF THE DRAWINGS

FIG. 3 is a block diagram showing a major part of a memory circuit according to the present invention;

FIG. 4 is a diagram showing waveforms of the memory circuit of FIG. 2 when the redundant structure is not used;

DETAILED DESCRIPTION OF THE PREFERRED EMBODIMENT

In the following, by way of example, an explanation will be given for the case where a redundant memory cell array is provided in such manner that a defective row (e.g., a defective word line) coupled to the faulty memory cell is replaced by a good row of the redundant memory cell array.

Figure 1:
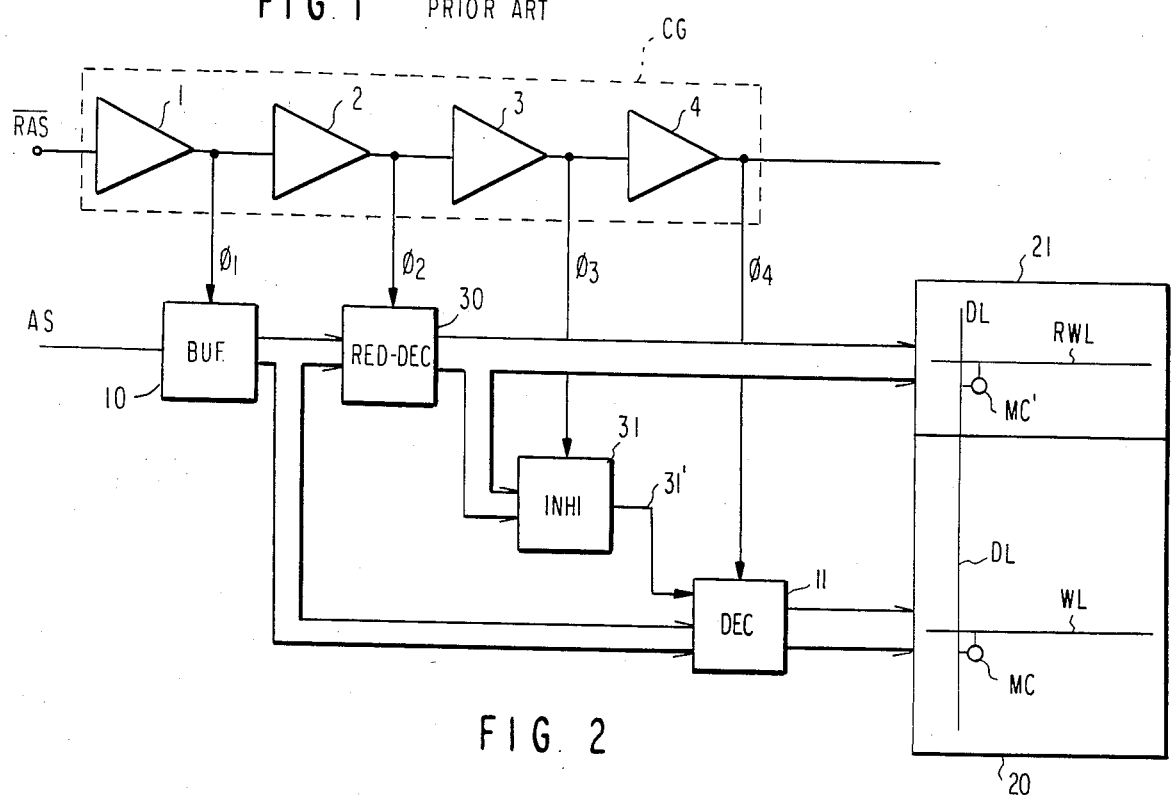
FIG. 1 is a block diagram showing a major part of a prior art redundant memory circuit.

First, with reference to FIG. 1, a prior art memory circuit of the type having a redundant structure will be explained.

A normal memory cell array 20 includes a plurality of memory cells MC arranged at intersections of word lines WL arrayed in rows and digit lines DL arrayed in columns. The word lines WL of the normal memory cell array 20 are connected to output terminals of a normal decoder circuit 11 in one by one relation. A redundant memory cell array 21 includes a plurality of redundant memory cells MC' arranged at intersections of redundant word lines RWL and the digit lines DL. The redundant word lines RWL are connected to output terminals of a programmable type redundant decoder circuit 30. An address buffer circuit 10 receives plural bit address signals AS and generates their true and complementary signals. The true and complementary address signals are applied to the redundant decoder circuit 30 and to the normal decoder. An inhibit control circuit is coupled to the outputs of the redundant decoder circuit to operatively inhibit the normal decoder circuit from operating when one of outputs of the redundant decoder circuit takes a selection level. A clock generator circuit includes delay circuits 1 to 4 connected in cascade. The delay circuit 1 receives a row strobe signal RAS and generates a first clock signal $\phi_1$ for enabling the address buffer circuit 10. The delay circuit 2 generates a second clock signal $\phi_2$ in response to the clock signal $\phi_1$ for enabling the redundant decoder circuit 30. The delay circuit 3 generates a third clock signal $\phi_3$ in response to the second clock signal $\phi_2$ for enabling the inhibit control circuit 31. The delay circuit 4 generates a fourth clock signal $\phi_4$ in response to the third clock signal $\phi_3$ for enabling the normal decoder 11.

The redundant decoder circuit 30 is programmed in such a manner that, when contents of the true and complementary address signals from the address buffer circuit 10 correspond to an address of a defective word line WL coupled to the defective memory cell in the normal memory cell array, the redundant decoder circuit 30 selects one of good redundant word lines RWL.

The operation of this prior art memory will be explained with reference to FIG. 2.

First, in response to an active level of the strobe signal RAS, the delay circuit 1 generates the first clock signal $\phi_1$. The address buffer circuit 10 is enabled by the clock $\phi_1$, so that the address buffer circuit 10 generates a plural bit true and complementary address signals (Ai, $\overline{Ai}$) and holds them. After establishment of the output state, the redundant decoder circuit is enabled in response to the occurrence of the second clock signal $\phi_2$. In this instance, if the contents of the plural bit address signals correspond to the defective word line of the normal memory cell array, the redundant decoder circuit 30 operates to select one good redundant word line RWL. On the contrary, if the contents of the address signals correspond to a good word line WL coupled to good memory cells in the normal memory cell array 20, the redundant decoder 30 selects no redundant word line RWL.

Then, after the output state of the redundant decoder circuit 30 is determined, the inhibit control circuit 31 is enabled by the third clock signal $\phi_3$. In this instance, when the redundant decoder circuit 30 has been selecting one of the redundant word lines RWL, the inhibit control circuit 31 generates an inhibit signal 31'. On the contrary, when none of the redundant word lines RWL have been selected by the redundant decoder circuit 30, the inhibit control circuit 31 does not produce the inhibit signal 31'.

In response to the occurrence of the fourth clock signal $\phi_4$, the normal decoder circuit 11 is enabled. However, in this instance, if the inhibit control circuit 31 has been producing the inhibit signal 31', the normal decoder circuit 11 does not select any one of the word lines WL. On the other hand, if the inhibit control circuit 31 has not been producing the inhibit signals 31', the normal decoder circuit 11 selects one of the word lines WL in the normal memory array 20. However, even the case where all of the elements of the normal memory cell array are perfectly good and the redundant memory cell array is not used, the normal decoder circuit 11 cannot operate until the time point when the fourth clock signal $\phi_4$ is generated. Therefore, unnecessary delay time is inevitably present from the operation of the address buffer circuit 10 to the operation of the normal decoder circuit 11, resulting a low speed operation.

Now with reference to FIGS. 3 through 9, a memory circuit in accordance with a first embodiment of the present invention will be explained.

FIG. 3 shows a major part of the memory circuit according to the present invention. In the drawing, components corresponding to those in FIG. 1 are designated by similar reference numerals. This embodiment is obtained by replacing the clock generator CG of FIG. 1 with a programmable type clock generator CG' as shown in FIG. 3. More specifically, in place of the delay circuit 4 of FIG. 1, a programmable delay circuit PD is employed. The programmable delay circuit PD includes a multi-input delay circuit 4' having one input terminal a coupled to the output of the delay circuit 3 and another input terminal b coupled to the output terminal of the delay circuit 1 through a fusible link 40 as to a programmable element. The multi-input delay circuit 4' generates an output to serve as the clock signal $\phi_4'$, the signal $\phi_4'$ corresponding to an OR logic combination of the input signals at the input terminals a and b.

Namely, while the fusible link 40 remains uncut, the delay circuit produces the signal $\phi_4'$ in response to the occurrence of the first clock signal $\phi_1$. Therefore, the signal $\phi_4'$ takes an active level with only a short delay time after the occurrence of the clock $\phi_1$. On the contrary, when the fusible link 40 is cut as a result of programming, the delay circuit 4' is no longer sensitive to the first clock signal $\phi_1$ but instead produces the signal $\phi_4'$ only in response to the occurrence of the clock signal $\phi_3$. The signal $\phi_4'$ then takes the active level with a large delay time after the occurrence of the clock signal $\phi_1$. The programming of the fusible link 40 is conducted as follows: When all functional elements in the normal memory cell array 20 are good, the fusible link 40 is uncut. On the contrary, when the normal memory cell array 20 includes at least one defective element to be replaced with good one from the redundant memory cell array 21, the fusible link 40 is cut.

The operation of the memory circuit of this embodiment will now be explained. First, an explanation will be given for the case where the normal memory cell 20 has no defective cell therein, with reference to FIG. 4. In this case, the fusible link 40 is uncut. When the row address strobe signal RAS changes to its active level, i.e., a low b level, the first clock signal $\phi_1$ changes from the low level to a high level. In response to the high level of the first clock signal $\phi_1$, the address buffer circuit 10 develops plural bit true and complementary address signals (Ai, $\overline{Ai}$) indicated as 10' in FIG. 4. In response to the high level of the first clock signal $\phi_1$, the clock signal $\phi_4'$ changes from the low level to the high level after a short delay time T has elapsed. The delay time T is provided to ensure completion of the operation of the address buffer circuit 10 prior to the operation of the normal decoder circuit 11. In response to the high level of the clock signal $\phi_4'$, the normal decoder circuit 11 performs the selection operation of the normal memory cell array 20. As a result of the selection operation, one of the output terminals of the normal decoder circuit 11 is switched to a high level while the remaining outputs are unselected and are maintained at a low level. Thus, accessing of the word line WL of the normal memory cell array is accomplished.

During this operation, the delay circuit 2 and 3 generate the second and third clock signals $\phi_2$ and $\phi_3$, respectively. However, the redundant decoder circuit 30 is programmed in such a manner that all output terminals (30') of the redundant decoder circuit 30 remain at a non-selected level. Also, the inhibit control circuit 31 does not generate the inhibit signal 31' even when the third clock signal $\phi_3$ is applied thereto, because no redundant word line RWL has been selected. Therefore, the delay circuits 2 and 3, the redundant decoder circuit 30, and the inhibit control circuit 31 do not affect the operation of accessing the normal memory cell array 20.

In the case where at least one defective memory cell is present in the normal memory cell array 20 (determined, e.g., by quality testing by the manufacturer), the fusible link 40 is cut and the delay circuit 4' will be responsive only to the third clock signal $\phi_3$. Accordingly, the delay circuit 4 produces the fourth clock signal $\phi_4$ after the occurrence of thesignal $\phi_3$. In this case, the memory circuit of this embodiment operates in the same manner as the circuit o shown in FIG. 1, and the clock signal $\phi_4'$ has the same waveform as that of in FIG. 2.

Next, with reference to FIGS. 5 to 9, the detailed structures of the respective components of this embodiment will be explained.

Figure 5:
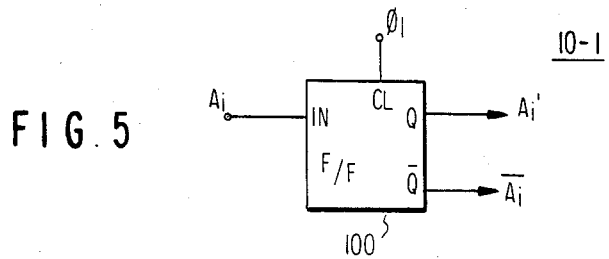
FIG. 5 is a diagram of an address buffer circuit in FIG. 2.

FIG. 5 shows a unit structure $10_i$ of the address buffer circuit 10. The unit structure $10_i$ is composed of a flip-flop circuit 100 receiving one bit Ai of the address input at its input terminal and the clock signal $\phi_1$ at its clock terminal CL. When the clock signal $\phi_1$ is activated, the flip-flop 100 generates true and complementary address signals Ai' and $\overline{Ai}$ at its output terminals Q and $\overline{Q}$, respectively. The address buffer circuit 10 includes the same number of the unit circuits $10_i$ as the number of address bits.

Figure 6:
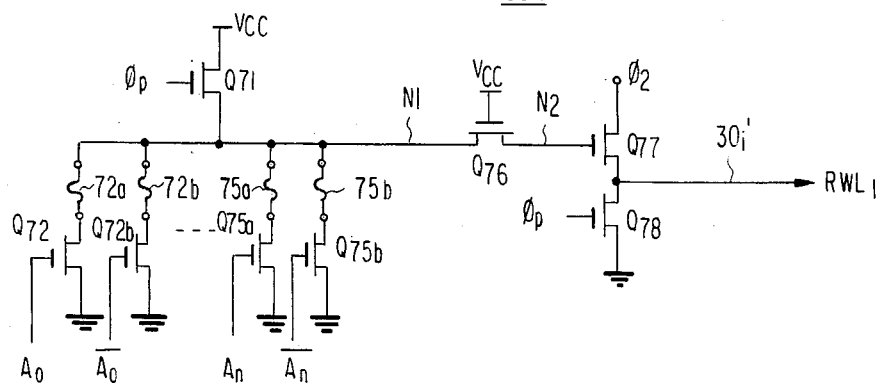
FIG. 6 is a circuit diagram of a programmable type redundant decoder circuit in FIG. 2.

FIG. 6 shows one unit circuit structure $30_i$ for one redundant word line in the programmable redundant decoder circuit 30. The unit $30_i$ of the redundant decoder includes a programmable type NOR circuit composed of a precharge transistor $Q_{71}$ coupled between a power voltage terminal Vcc and a node N1, and a plurality of input transistors $Q_{72a}, Q_{72b} \ldots, Q_{75a}, Q_{75b}$ receiving respective ones of the true and complementary signals from the buffer circuit 10 at their gates. The transistors $Q_{72}$ to $Q_{75}$ are connected to the node N1 via fusible links 72a, 72b ... 75a, 75b, respectively. (It should be noted that these reference numbers are used solely for convenience of description, and that in fact there may be a large number of input transistors and fusible links.) The node N1 is connected to a node N2 via a transistor $Q_{76}$ whose gate is biased by the power voltage Vcc. A transistor $Q_{77}$ has a gate coupled to the node N2, a drain adapted to receive o the clock signal $\phi_2$ and a source connected to an output line $30_i$ to be connected to one of the redundant word lines RWLi. A reset transistor $Q_{78}$ is connected between the source of the transistor $Q_{77}$ and ground potential.

In this unit circuit $30_i$, when the redundant word line RWLi is not needed to replace the word line WL of the normal memory cell array 20, all of the fusible links 72a, 72b ... 75a, 75b remain uncut. When the redundant word line RWLi connected to this unit circuit $30_i$ is to replace the defective word line WL, the fusible links 72a, 72b ... 75a, 75b are selectively cut in such a manner that, when the contents of the address signals correspond to the defective word line WL in the normal memory cell array 20, the potential at the node N1 is kept at the high level. For example, if the address of the defective word line WL in the normal memory cell array 20 is designated by $(A_0, A_1, A_2, A_3, A_4, A_5)=(0, 0, 0, 1, 1, 1)$, then the fusible links coupled to the input transistors receiving the address signals $\overline{A_0}, \overline{A_1}, \overline{A_2}, A_3, A_4$ and $A_5$ cut while the fusible links coupled to the input transistors receiving the address signals $A_0, A_1, A_2, \overline{A_3}, \overline{A_4}$ and $\overline{A_5}$ uncut. In general, according to the replacement address information, the fusible link associated with either the true or complementary address signal bit is cut while the other fusible link is left uncut. The fusible links 72 to 75 are typically made of polycrystalline silicon formed on a semiconductor substrate.

Here, a precharge control signal $\phi_p$ for controlling the transistors $Q_{71}$ and $Q_{78}$ is activated when the row strobe signal $\overline{RAS}$ is inactive level and inactivated when the row strobe signal $\overline{RAS}$ is made activated.

Operation of this circuit $30_i$ is as follows. First, in response to the active level of the precharge control signal $\phi_p$, the transistors $Q_{71}$ and $Q_{78}$ become conducting to precharge the node N1 with the power voltage and set the output line $30_i$ at ground potential. Then, the logic levels at nodes N1 and N2 will be determined by the states of the address signals $A_0, \overline{A_0} \ldots A_n, \overline{A_n}$. Next, in response to the clock signal $\phi_2$, the transistor $Q_{77}$ drives the redundant word line RWLi only when the nodes N1 and N2 are at the high level.

It should be remembered that there will preferably be a plurality of circuits $30_i$ corresponding to a respective plurality of redundant row lihes RWLi.

Figure 7:
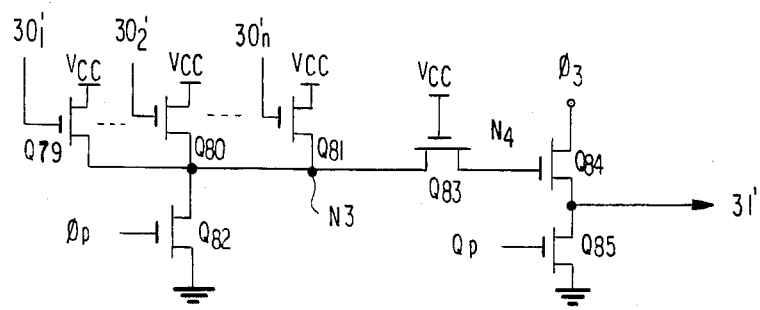
FIG. 7 is a circuit diagram of an inhibit control circuit in the memory of FIG. 2.

FIG. 7 shows one example of circuitry for the inhibit control circuit 31. In the drawing, transistors $Q_{79} \ldots Q_{81}$ receiving the outputs $30_1' \ldots 30_n'$ of the redundant decoder circuit 30 at their gates form an OR gate with a reset transistor $Q_{82}$ controlled by the precharge control signal $\phi_p$. An output node N3 of the above OR gate is connected to a gate (N4) of a transistor $Q_{84}$ via a drain-source path of a transistor $Q_{83}$ whose gate is biased by the power voltage Vcc. The transistor $Q_{84}$ has a drain receiving the clock signal $\phi_3$ and a source serving as the output 31' of the circuit 31. A transistor $Q_{85}$ is connected between the output 31' and ground potential to reset the output 31' in response to the reset signal $\phi_p$.

When one of the outputs $31_1'$ to $30_n'$ becomes a high level (Vcc), then the gate (N4) of the transistor $Q_{84}$ is set a high level and hence the output 31' is driven to a high level in response to the active level of the clock signal $\phi_3$.

Figure 8:
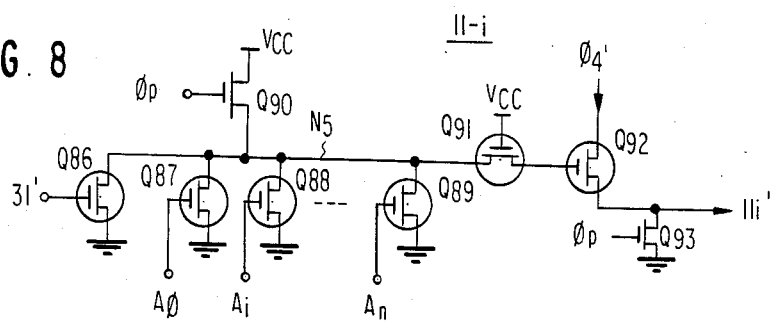
FIG. 8 is a circuit diagram of a normal decoder circuit employed in FIG. 2.

FIG. 8 shows a unit circuit structure $11_i$ for one word line in the normal decoder circuit 11. Transistors $Q_{86}, Q_{87} \ldots Q_{89}$ form a NOR gate together with a precharge transistor $Q_{90}$ in a known manner. The transistors $Q_{87}, Q_{88}$ $Q_{89}$ receive their associating true and complementary address signals $(A_0/\overline{A_0}) \ldots (A_i/\overline{A_i}) \ldots (A_n/\overline{A_n})$ in the same manner as the conventional decoder. Here, in order to inhibit an output node N5 from being selected, the transistor $Q_{86}$ receiving the inhibit control signal 31' is added in parallel with the transistors $Q_{87}$ to $Q_{89}$.

The node N5 is connected via transistor $Q_{91}$ to a gate of a drive transistor $Q_{92}$. The transistor $Q_{92}$ has a drain receiving the clock signal $\phi_4'$ and a source serving as an output $11_i 40$ to be connected to one of the word lines WLi. A reset transistor $Q_{93}$ is connected between the output $11_i'$ and ground potential.

When the inhibit control signal 31' is at a low level, the circuit $11_i'$ operates in the same manner as the conventional decoder. However, when the inhibit control signal 31' is at a high level, the level of the node N5 becomes low (ground level) irrespective of the states of the transistors $Q_{87}$ to $Q_{89}$ so that the selection of the word line Wli is inhibited.

Figure 2:
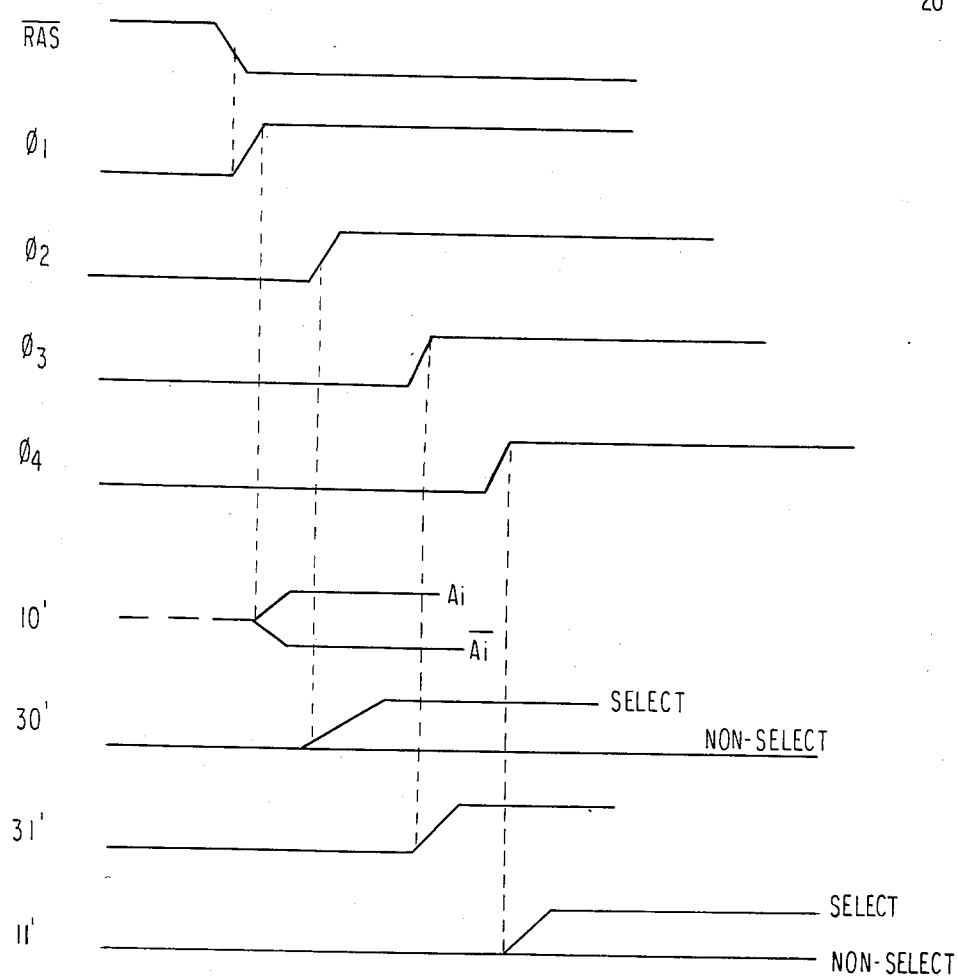
FIG. 2 is a diagram showing waveforms for explaining operation of the circuit shown in FIG. 1.
Figure 9:
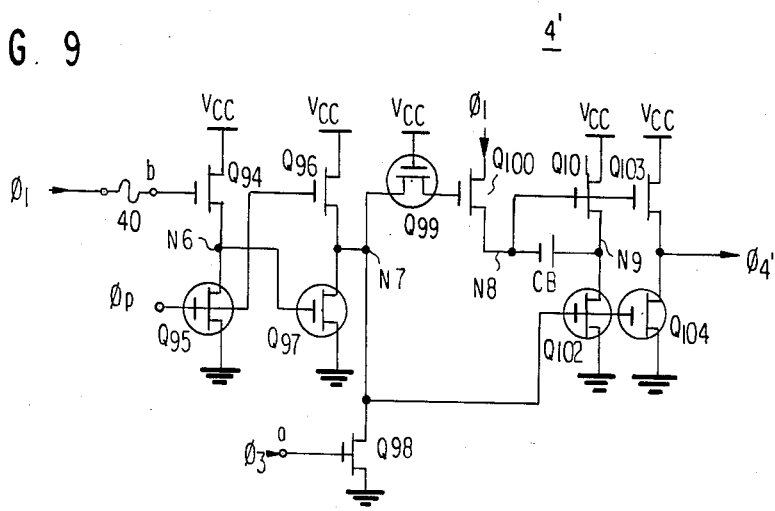
FIG. 9 is a circuit diagram of a multi-input delay circuit employed in FIG. 2.

FIG. 9 shows one example of circuitry for the delay circuit 4' in FIG. 2. A series circuit of a transistor $Q_{94}$ having a gate connected to the input b and a transistor $Q_{95}$ having a gate receiving the precharge control signal $\phi_p$ serves as a buffer circuit for receiving the clock signal $\phi_1$. A transistor $Q_{97}$ having a gate connected to an output node N6 of the buffer circuit and a transistor $Q_{98}$ having a gate connected to the input terminal a form an OR gate with a precharge transistor $Q_{96}$ controlled by the precharge control signal $\phi_p$. An output node N7 of the OR gate is input to a delay-type buffer circuit composed of transistors $Q_{99}$ to $Q_{104}$ and a boot capacitor $C_B$.

The operation when the fusible link 40 remains uncut will now be described. First, in response to the active level of the precharge control signal $\phi_p$, the node N6 is set at a low level while the node N7 is kept at a high level. In this instance, since the conductance of transistor $Q_{102}$ is greater than that of transistor $Q_{101}$, node N8 will be at a high level and node N9 will be set at a low level, and the capacitor $C_B$ is charged.

Next, after the signal $\phi_p$ becomes inactive, the clock signal $\phi_1$ becomes active so that the node N6 changes from low to high and the node N7 changes from high to low. Therefore, the potential at the node N9 starts to rise so that the potential at the node N8 is raised above the power voltage Vcc by a known boot-strap effect. As a result, the high Vcc level is output as the clock signal $\phi_4'$. In this case, since the clock signal $\phi_3$ is made active after the activation of the signal $\phi_1$, the clock signal $\phi_3$ does not affect the above operation.

Operation when the fusible link 40 is cut will now be explained. First, in response to the activation of the precharge control signal $\phi_p$, the node N7 is set at a high level so that the capacitor $C_B$ is charged. After the charge control signal becomes inactive, the clock signal $\phi_1$ becomes active. However, since the fusible link 40 is cut, the state of the delay circuit 4' does not change by the activation of the clock signal $\phi_1$. After the predetermined period of time has passed from the activation of the clock signal $\phi_1$, the clock signal $\phi_3$ becomes active. Therefore, the node N7 becomes low so that the signal $\phi_4'$ becomes high.

Figure 10:
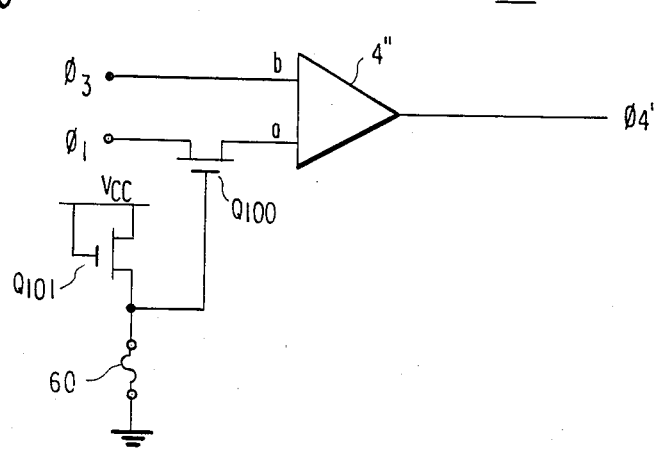
FIG. 10 is a partial schematic diagram showing another embodiment of the invention.

With reference to FIG. 10, a second embodiment of the present invention will be described. This embodiment is obtained by replacing the programmable delay circuit PD of FIG. 2 with another programmable delay circuit PD' shown in FIG. 10.

The programmable delay circuit PD' comprises a delay circuit 4" equivalent to the delay circuit 4' in FIG. 2, a transfer gate transistor $Q_{100}$, and a program circuit composed of a transistor $Q_{101}$ and a polycrystalline silicon link 60. The transfer gate transistor $Q_{100}$ is inserted in series between the electrical path for applying the clock signal to an input terminal a of the delay circuit 4". An input terminal b of the delay circuit 4" is connected to receive the clock signal $\phi_3$.

Here, programming is performed by changing a resistance value of the polycrystalline silicon link 60. Namely, when the normal memory cell array (20 in FIG. 2) has no defective element, the polycrystalline silicon link is made to have a large resistance value so as to make the transfer gate. transistor $Q_{100}$ conducting In this case, the signal $\phi_4'$ is generated in response to the clock signal $\phi_1$.

On the contrary, in the case where the normal memory cell array has at least one defective word line to be replaced with the redundant word line, the polycrystalline silicon link 60 is made to have a small resistance value so as to make the transistor $Q_{100}$ non-conducting. In this case, the delay circuit 4" generates the clock signal $\phi_4'$ in response to the clock signal $\phi_1$.

Figure 11:
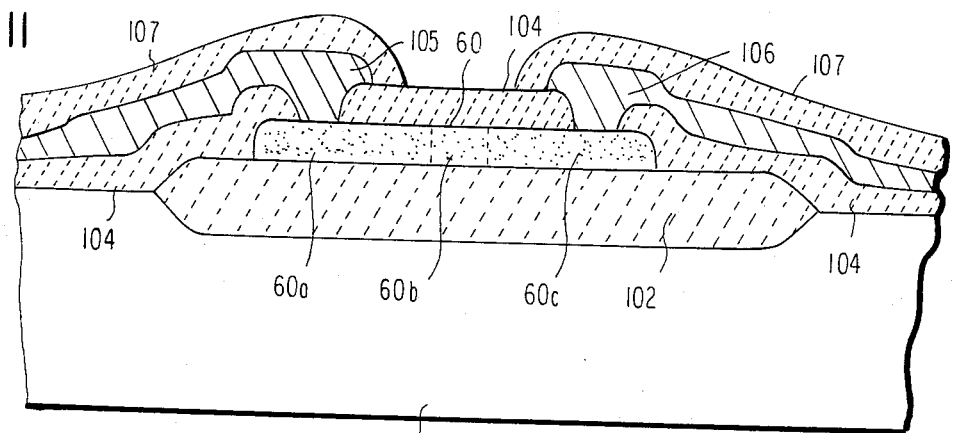
FIG. 11 is a sectional view showing an example of a structure of a fusible link employed in the invention.

With reference to FIG. 11, a practical example of the polycrystalline silicon link 60 will be explained. A thick field oxide 102 is selectively formed on a semiconductor substrate 101. A polycrystalline silicon 60 is formed on the field oxide 102. The polycrystalline silicon 60 has first and second portions 60a and 60c which are highly doped with an impurity and a third portion 60b in which the impurity concentration is not substantial. Aluminum wirings 105 and 106 are formed on silicon-dioxide layer 104 and connected to the first and second portions 60a and 60c of the polycrystalline silicon 60. The aluminum wirings 105 and 106 are covered by a silicon-dioxide layer 107. The state of the polycrystalline silicon thus obtained corresponds to a high resistance state in which the transistor 100 is conducting.

In the case where the polycrystalline silicon 60 is required to have a low resistance value for inhibiting the transistor $Q_{100}$ from conducting, the impurity doped in the portions 60a and 60c of the polycrystalline silicon is diffused into the portion 60b by annealing the polycrystalline silicon 60. Such annealing is preferably conducted by heating the polycrystalline silicon 60 by a known laser annealing technique.

Figure 12:
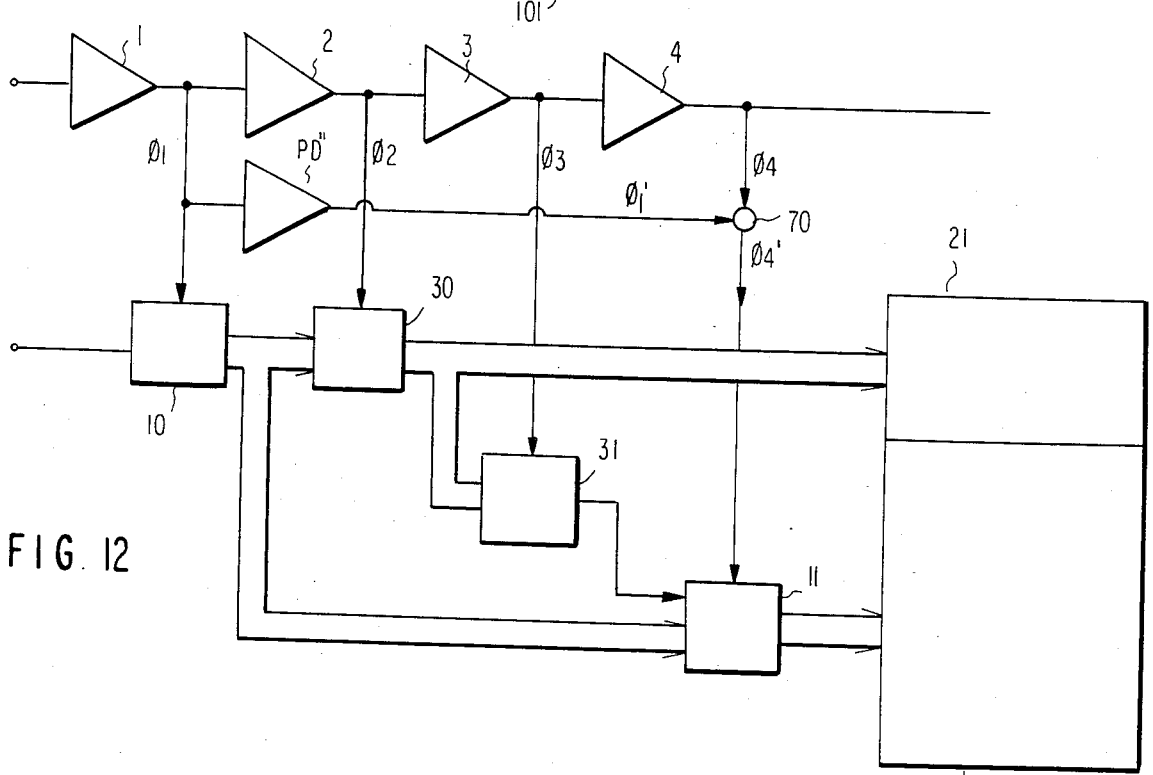
FIG. 12 is a block diagram showing a memory in accordance with still another embodiment of the invention.

Now, with reference to FIGS. 12 and 13, a third embodiment of the present invention will be described. Corresponding portions to those in FIGS. 1 and 2 are designated by similar reference numerals. This embodiment is obtained by providing a programmable type delay circuit PD" to the memory circuit shown in FIG. 1. An input terminal of the delay circuit PD" is connected to the output terminal of the dealy circuit 1, and an output terminal of the circuit PD" is connected together with the output terminal ($\phi_4$) of the delay circuit in a wired-OR connection 70. The delay circuit PD" has two programmed states. One state is an active state in which the circuit PD" generates an output signal $\phi_1'$ in response to the clock signal $\phi_1$. The other state is an inactive state in which the circuit PD" never produces the output $\phi_1'$ irrespective of the clock signal $\phi_1$.

The output $\phi_1'$ of the circuit PD" is connected with the signal $\phi_4$ of the delay circuit 4 at the junction 70 in in a wired-OR manner, and hence when, the circuit PD" is o programmed in the active state, the signal $\phi_4'$ from the junction 70 is the same as the signal $\phi_1$. On the other hand, when the circuit PD" is programmed in the inactive state, that the signal $\phi_4'$ becomes the same as the signal $\phi_4$ from the delay circuit.

Figure 13:
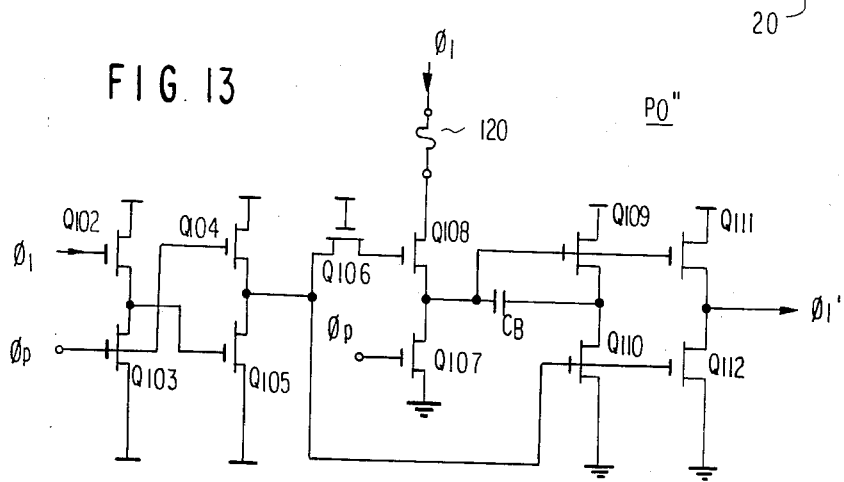
FIG. 13 is a schematic diagram showing a delay circuit employed in the memory circuit in FIG. 12.

With reference to FIG. 13, a practical example of the circuit PD" of FIG. 12 will be explained. Transistors $Q_{102}$ to $Q_{105}$ form a buffer stage for receiving the signal 1 Transistors $Q_{106}$ to $Q_{112}$ form a boot-strap type delay circuit. Here, the signal $\phi_1'$ is applied to a drain of the transistor $Q_{108}$ via a fusible link 120. When the fusible link 120 remains uncut, the circuit PD" generates the output signal $\phi_1$. On the contrary, when the fusible link is cut, a gate of the transistor $Q_{109}$ cannot be raised in potential, and hence the circuit PD" does not produce the signal $\phi_1'$.

Though the present invention has been explained in connection with preferred embodiments, it should be apparent that the present invention is not limited to those embodiments.

I claim:

1. A memory circuit comprising a first array of memory cells arrayed in rows and columns, a second array of memory cells arrayed in rows and columns, a row address buffer receiving a plurality of row address signals for operatively generating their true and complementary signals, a first row decoder responsive to said true and complementary signals for operatively selecting one of the rows of said first array, a second row decoder responsive to said true and complementary signals for operatively selecting one of the rows of said second array, an inhibit control circuit coupled to said first row decoder and operatively inhibiting the operation of said second row decoder when said first row decoder selects said first array, a first timing circuit responsive to a control signal for generating a first timing siganl for enabling said address buffer, a second timing circuit responsive to said first timing signal for generating a second timing signal for enabling said first row decoder, a third timing circuit responsive to said second timing signal for generating a third timing signal for enabling said inhibit control circuit, a multi-input timing circuit having a first input terminal adapted to receive said third timing signal and a second input terminal, each of said timing sigals having active and inactive potential levels, said multi-input timing circuit generating a fourth timing signal for enabling said second row decoder when a potential of any one of said first and second input terminals is set at an active level, and a programmable connection circuit coupled between said second input terminal of said multi-input timing circuit and the output of said first timing circuit.

2. The memory circuit according to claim 1, wherein said programmable connection circuit includes a fusible link inserted in the electrical path between said second input terminal and the output of said first timing circuit.

3. The memory circuit according to claim 2, wherein said fusible link is made of polycrystalline silicon 4. The memory circuit according to claim 1, wherein said programmable connection circuit includes a first transistor inserted in the electrical path between said second input terminal and the output of said first timing circuit, a series circuit of a second transistor and a programmable resistor element connected at an intermediate junction, said first transistor having a control electrode for controlling the conductivity thereof, and connection means for connecting said control electrode to said intermediate junction.

5. The memory circuit according to claim 4, wherein said programmable resistor element is made of polycrystalline silicon.

6. A memory circuit which receives a control signal having active and inactive levels and address information and performs a memory access operation in accordance with the received address information under control of the received signal, said memory comprising a normal array of memory cells, a redundant array of memory cells, a normal decoder circuit enabled only when a first clock signal applied thereto is at an active level to thereby access at least one cell in said normal array in accordance with said address information, a redundant decoder circuit enabled only when a second clock signal applied thereto is at an active level to thereby access at least one cell in said redundant array in accordance with said address information when said normal array includes at least one faulty cell and said address information corresponds to the address of the faulty cell in said normal array, means for providing a control signal, a first clock signal generating circuit responsive to an active level of said control signal for generating said firt clock signal for enabling said normal decoder circuit, and a second clock signal generating circuit responsive to a change to the active level of said control signal for generating second clock signal of the active level for enabling said redundant decoder circuit before enabling said normal decoder circuit, said first clock signal generating circuit including programmable means which is programmed to a first state when said normal array includes at least one faulty cell and to a second state when said normal array has no faulty cell, said first clock signal generating circuit generating said first clock signal with a first delay time from the change to the active level of said control signal irrespective of content of said address information when said programmable means is programmed to said first state and with a second delay time from the change to the active level of said control signal irrespective of content of said address information when said programmable means is programmed to said second state, said second delay time being shorter than said first delay time.

7. The memory circuit according to claim 6, wherein said redundant decoder circuit includes a programmable type redundant decoder for accessing said redundant array and an inhibit control circuit for inhibiting the operation of said normal decoder circuit when said redundant decoder selects said redundant array.

8. The memory circuit according to claim 6, wherein said redundant decoder circuit includes a plurality of programmable elements.

9. The memory circuit according to claim 8, wherein each of said programmable elements includes a fusible link made of polycrystalline silicon.

10. The memory circuit according to claim 6, wherein said programmable means includes a fusible link made of polycrystalline silicon.

11. The memory circuit acccording to claim 6, wherein said first clock signal generating circuit includes an OR gate having first and second input terminals, means for providing to said second input terminal a third clock signal generated with a third delay time from the change to the active level by said control signal between said first and second delay times, and means for applying said control signal to said first input terminal when said programmable means is programmed to said second state.

12. A memory circuit which receives a control signal and address information and in which a memory cell is selected in responses to the received address information under control of the received control signal, comprising a normal memory cell array; a first decoder circuit for operatively selecting a cell in said normal cell array in accordance with said address information; a redundant memory cell array, a second decoder circuit for operatively selecting a cell in said redundant memory cell array when said normal memory cell array includes at least one faulty cell and said address information corresponds to a faulty cell in said normal cell array; said second decoder being enabled only when a first clock signal is applied thereto to thereby select a cell in said redundant array, said first decoder being enabled after said second decoder is enabled and only when a second clock signal is applied thereto to select a cell in said normal array; a programmable element which is programmed to a first state when said normal memory cell array includes at least one faulty cell and a second state when said normal memory cell array includes no faulty cell; and first clock means for generating said first clock signal for enabling said second decoder when a first time period has elapsed from the receipt of said control signal, a second clock generating means for generating said second clock signal to enable said first decoder irrespective of said address information when a second time period has elapsed from the receipt of said control signal in the case of said firt state of said programmable element and a third time period has elapsed from said receipt of said control signal in the case of said second state of said programmable element, said second time period being longer than said first time period, said third time period being shorter than said second time period.

13. The memory circuit according to claim 12, wherein said second clock generating means includes an OR circuit having first and second input terminals.

14. The memory circuit according to claim 12, further comprising means for determining whether a cell to be selected is in said normal array or redundant array.

15. A memory circuit which receives a control signal and address information and in which a memory cell is selected by use of the received address information under control by the received control signal comprising a first array of memory cells, a second array of memory cells, means for receiving said address information, a first decoder circuit for operatively selecting a cell in said first array in accordance with said address information, a second decoder circuit for operatively selecting a cell in said second array, means coupled to said second decoder for inhibiting said first decoder from selecting said first array when said second decoder selects said second array, said second decoder being enabled by a first clock signal, said inhibiting means enabled by a second clock signal, said first decoder being enabled by a third clock signal, said inhibiting means being enabled after enabling of said second decoder, said first decoder being enabled after said enabling of said second decoder, said second decoder including a plurality of programmable elements and selecting said second array when the content of said address information is consistent with the state of said programmable elements, means for generating said first clock signal for enabling said second decoder when a first period of time has elapsed from the receipt of said control signal, means for generatng said second clock signal for enabling said inhibiting means after said first clock signal is generated, and programmable delay means for generating said third clock signal for enabling said first decoder, said programmable delay means generating said third clock signal after said second clock signal is generated when said second decoder is programmed to select a cell in said second array, and before the generation of said second clock signal when said second decoder is programmed not to select a cell in said second array.

16. The memory circuit according to claim 15, wherein said programmable delay means includes an OR circuit having first and second input terminals, means for applying said second clock signal to said first input terminal, and a programmable connection circuit having one end coupled to said second input terminal and the other and supplied with a first clock signal generated before said second clock signal.

* * * * *